United States Patent
Choi et al.

(10) Patent No.: US 9,281,202 B2
(45) Date of Patent: Mar. 8, 2016

(54) NONVOLATILE MEMORY CELL AND METHOD FOR FABRICATING THE SAME

(75) Inventors: Tae-Ho Choi, Cheongju-si (KR);
Jung-Hwan Lee, Cheongju-si (KR);
Heung-Gee Hong, Cheongju-si (KR);
Jeong-Ho Cho, Cheongju-si (KR);
Min-Wan Choo, Cheongju-si (KR);
Il-Seok Han, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 489 days.

(21) Appl. No.: 12/604,757

(22) Filed: Oct. 23, 2009

(65) Prior Publication Data
US 2010/0270605 A1    Oct. 28, 2010

(30) Foreign Application Priority Data

Feb. 13, 2009  (KR) .............................. 2009-0011908

(51) Int. Cl.
| | |
|---|---|
| *H01L 29/423* | (2006.01) |
| *H01L 21/28* | (2006.01) |
| *H01L 29/51* | (2006.01) |
| *H01L 29/66* | (2006.01) |
| *H01L 29/788* | (2006.01) |

(52) U.S. Cl.
CPC .... *H01L 21/28273* (2013.01); *H01L 29/42324* (2013.01); *H01L 29/512* (2013.01); *H01L 29/66825* (2013.01); *H01L 29/7881* (2013.01)

(58) Field of Classification Search
CPC .................. H01L 21/28273; H01L 29/42324; H01L 29/66825; H01L 29/7881
USPC ............ 257/315, 316, 321, E21.64, E21.645, 257/E21.682, E29.3; 438/201, 257, 265, 438/266, 267
See application file for complete search history.

(56) References Cited

U.S. PATENT DOCUMENTS

| | | | | |
|---|---|---|---|---|
| 5,780,341 | A | * | 7/1998 | Ogura ........................... 438/259 |
| 6,051,860 | A | * | 4/2000 | Odanaka et al. ............... 257/316 |
| 6,074,914 | A | * | 6/2000 | Ogura ........................... 438/257 |
| 6,184,553 | B1 | | 2/2001 | Odanaka et al. |
| 6,284,596 | B1 | * | 9/2001 | Sung et al. .................... 438/257 |

(Continued)

FOREIGN PATENT DOCUMENTS

| | | |
|---|---|---|
| JP | 11-260944 A | 9/1999 |
| JP | 11-284087 A | 10/1999 |

(Continued)

OTHER PUBLICATIONS

Korean Office Action issued on Oct. 26, 2010, in corresponding Korean Patent Application No. 10-2009-0011908 (5 pages).

(Continued)

*Primary Examiner* — David Vu
(74) *Attorney, Agent, or Firm* — NSIP Law

(57) ABSTRACT

A nonvolatile memory cell and a method for fabricating the same can secure stable operational reliability as well as reducing a cell size. The nonvolatile memory cell includes a drain region formed in a substrate, a source region formed in the substrate to be separated from the drain region, a floating gate formed over the substrate between the drain region and the source region, a halo region formed in the substrate in a direction that the drain region is formed, a dielectric layer formed on sidewalls of the floating gate, and a control gate formed over the dielectric layer to overlap with at least one sidewall of the floating gate.

28 Claims, 16 Drawing Sheets

(56) References Cited

U.S. PATENT DOCUMENTS

| | | |
|---|---|---|
| 6,348,378 B1 * | 2/2002 | Lee .................... 438/257 |
| 6,737,700 B1 * | 5/2004 | Chang et al. ............ 257/315 |
| 7,602,008 B2 * | 10/2009 | Kang et al. ............. 257/319 |
| 7,635,898 B2 * | 12/2009 | Kim et al. .............. 257/369 |
| 8,617,951 B2 * | 12/2013 | Matsuzaki et al. ........ 438/264 |
| 2001/0001295 A1 | 5/2001 | Odanaka et al. |
| 2006/0118857 A1 | 6/2006 | Jeong |
| 2006/0199336 A1 | 9/2006 | Kang et al. |
| 2007/0155153 A1 | 7/2007 | Okazaki et al. |
| 2008/0093647 A1 | 4/2008 | Kang et al. |
| 2010/0159687 A1 | 6/2010 | Okazaki et al. |
| 2011/0014783 A1 | 1/2011 | Okazaki et al. |
| 2011/0175231 A1 | 7/2011 | Okazaki et al. |

FOREIGN PATENT DOCUMENTS

| | | |
|---|---|---|
| JP | 2005-57106 A | 3/2005 |
| JP | 2006-253685 A | 9/2006 |
| JP | 2007-184323 A | 7/2007 |
| JP | 2007-258382 A | 10/2007 |
| KR | 10-0270958 | 2/2000 |

OTHER PUBLICATIONS

Taiwanese Office Action issued in counterpart Taiwanese Patent Application No. 098134425 on Jan. 29, 2013. (11 pages including English Translation).

Japanese Office Action issued Apr. 1, 2014 in counterpart Japanese Application No. JP2010-025773 (3 pages, in Japanese).

Japanese Office Action mailed Jan. 6, 2015 in counterpart Japanese Application No. 2010-025773 (4 pages, in Japanese).

* cited by examiner

MC

NONVOLATILE MEMORY CELL AND METHOD FOR FABRICATING THE SAME

CROSS-REFERENCE TO RELATED APPLICATIONS

The present invention claims priority of Korean Patent Application No. 10-2009-0011908 filed on Feb. 13, 2009 which is incorporated herein by reference in its entirety.

BACKGROUND OF THE INVENTION

1. Field of the Invention

The present invention relates to a nonvolatile memory device and a method for fabricating the same, and more particularly, to a nonvolatile memory cell and a method for fabricating the same.

2. Description of Related Art

Since a nonvolatile memory device maintains data stored in memory cells even when power to the device is turned off, it is used in various applications and its importance is also increasing. As representative nonvolatile memory devices, a flash memory device and an electrical erasable programmable read only memory (EEPROM) device are well known.

A cell of the nonvolatile memory device, i.e., a nonvolatile memory cell, may be classified into a split gate structure and a stack gate structure spoken as electrically tunneling oxide (ETOX). The stack gate structure includes a stack structure where a floating gate and a control gate are sequentially stacked. The split gate structure is constructed of a floating gate and a structure that has one portion overlapping with the floating gate and the other portion horizontally disposed along a surface of a substrate.

FIG. 1 illustrates a cross-sectional view of a nonvolatile memory cell including the stack gate structure according to the prior art.

Referring to FIG. 1, the conventional nonvolatile memory cell includes a gate constructed of a stack structure. That is, a tunnel insulation layer 12, a floating gate 14, a dielectric layer 16 and a control gate 18 are sequentially formed over a substrate 10. In addition, a drain region 20 and a source region 22 are formed in portions of the substrate 10 that are aligned with and exposed at both sides of the control gate 18.

This stack gate is being widely used by its simple construction and the simplicity of fabricating processes. Specially, it is widely used when fabricating high density products. However, the stack gate may induce several problems when implementing a complicated operation by its simple construction. To solve the problems, various design technologies or test technologies are required. Furthermore, an additional area is required to apply the technologies to the chip construction. Accordingly, in low density products, a small size of the memory cell may not be an advantage anymore.

FIG. 2 illustrate a cross-sectional view of a nonvolatile memory cell including the split gate structure according to the prior art.

Referring to FIG. 2, in the nonvolatile memory cell, a control gate 38 is formed on a dielectric layer 36 to partially overlap with the top and one sidewall of a floating gate 34. A tunnel insulation layer 32 and the floating gate 34 are sequentially stacked over a substrate 30. Moreover, a drain region 40 is aligned with one side of the control gate 38 and a source region 42 is aligned with one side of the floating gate 34, wherein the drain region 40 and the source region 42 are formed in portions of the substrate 30 that are exposed.

The split gate is widely used by its excellencies of the operational reliability although it is not appropriate for a high density memory device by its great cell size. For instance, since the split gate can prevent the over erase that is a problem of the stack structure, it is used in the low density products or embedded memory devices. The reason why the spit gate is able to prevent the over erase is that it can maintain a threshold voltage of a memory cell constantly.

As described above, in an aspect of the operational reliability, the split gate shows more excellent performance than the stack gate. However, since the size of a cell including the split gate is great, there are many difficulties to apply the split gate to the high density memory device. Therefore, it is required to provide a nonvolatile memory cell that is applicable to the high density memory device by stably securing the operational reliability and accomplishing high integration, and operable in low voltage by lowering a driving voltage.

SUMMARY OF THE INVENTION

An embodiment of the present invention is directed to providing a nonvolatile memory cell and a method for fabricating the same, capable of securing stable operational reliability as well as reducing a cell size.

Another embodiment of the present invention is directed to providing a nonvolatile memory cell and a method for fabricating the same, capable of increasing a coupling ratio and thus reducing a driving voltage.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an aspect of the present invention, there is provided a nonvolatile memory cell including: a drain region formed in a substrate; a source region formed in the substrate to be separated from the drain region; a floating gate formed over the substrate between the drain region and the source region; a halo region formed in the substrate in a direction that the drain region is formed; a dielectric layer formed on sidewalls of the floating gate; and a control gate formed over the dielectric layer to overlap with at least one sidewall of the floating gate.

In accordance with another aspect of the present invention, there is provided a method for fabricating a nonvolatile memory cell, the method including: forming a floating gate over a substrate; forming a hard mask over the floating gate; forming a dielectric layer on sidewalls of the hard mask and the floating gate; forming a control gate over the dielectric layer to overlap with at least one sidewall of the floating gate; forming a halo region in the substrate; forming a drain region in a portion of the substrate that is exposed toward one side of the dielectric layer, wherein the halo region is formed in the portion of the substrate; and forming a source region in the substrate.

DESCRIPTION OF SPECIFIC EMBODIMENTS

Figure 1:
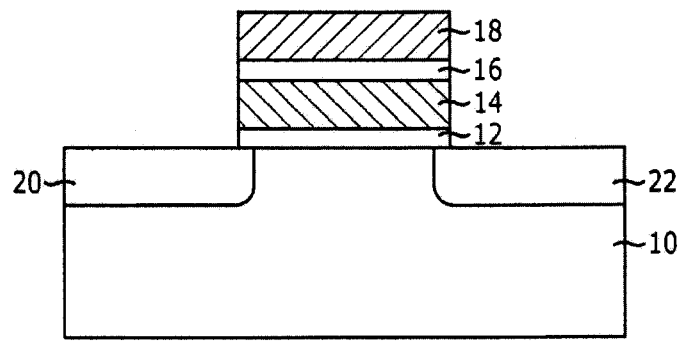
FIG. 1 illustrates a cross-sectional view of a nonvolatile memory cell including a stack gate structure according to the prior art.
Figure 2:
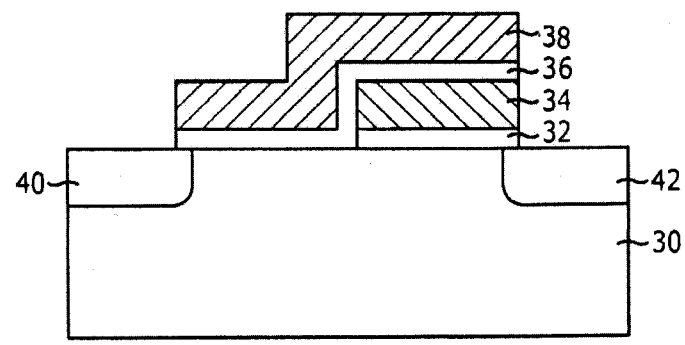
FIG. 2 illustrates a cross-sectional view of a nonvolatile memory cell including a split gate structure according to the prior art.

The advantages, features and aspects of the invention will become apparent from the following description of the embodiments with reference to the accompanying drawings, which is set forth hereinafter.

Referring to the drawings, the illustrated thickness of layers and regions are exaggerated to facilitate explanation. When a first layer is referred to as being 'on' a second layer or 'on' a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

In the description of the present invention, the term 'one sidewall' means a left sidewall or a right sidewall of a target layer and the term 'both sidewalls' means all of the left sidewall and the right sidewall. Furthermore, the term 'adjacent' means that the target layer partially overlaps with a certain layer without being directly in contact with the certain layer, or a part of the target layer is directly in contact with the certain layer. In addition, the term 'one side' means a left side or a right side of the target layer and the term 'both sides' means all of the left side and the right side.

Figure 3:
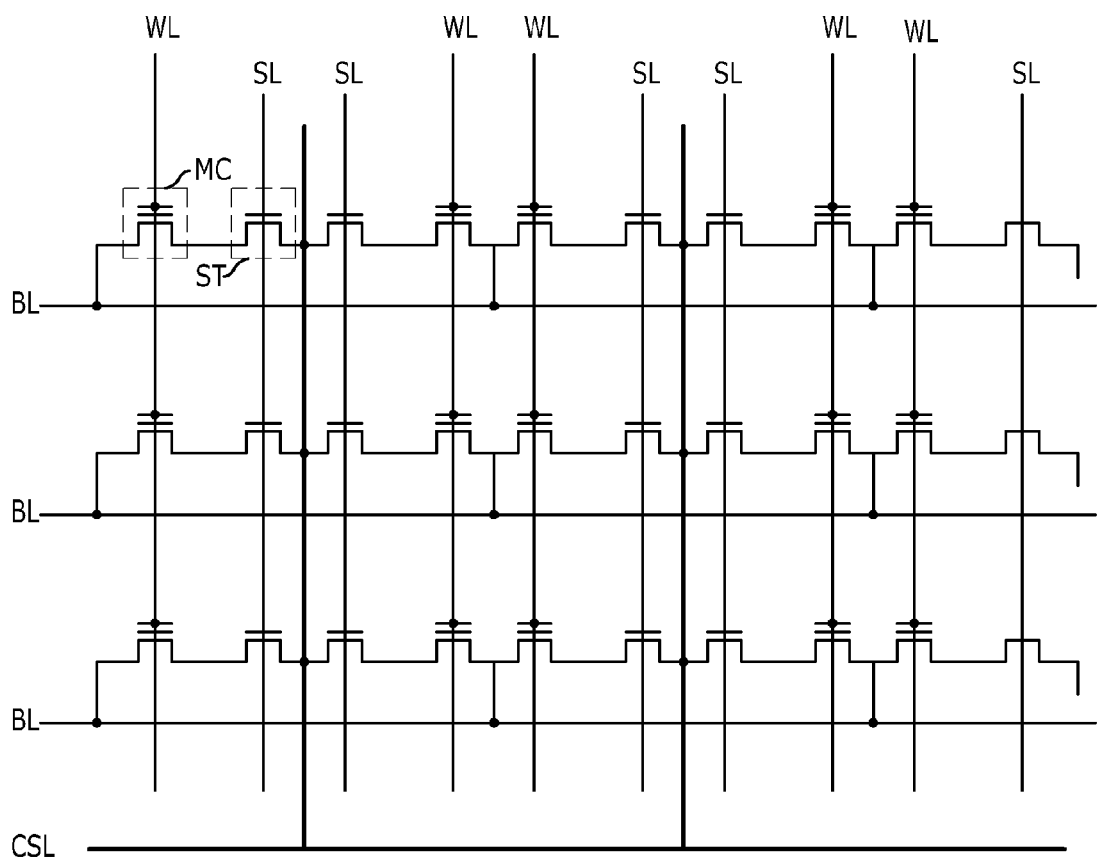
FIG. 3 illustrates a cell array structure including nonvolatile memory cells in accordance with embodiments of the present invention.

First of all, there will be described a memory cell array structure of a nonvolatile memory device including nonvolatile memory cells in accordance with embodiments of the present invention. FIG. 3 illustrates an equivalent circuit diagram of the memory cell array structure including the nonvolatile memory cells in accordance with the embodiments of the present invention.

Referring to FIG. 3, the memory cell array of the nonvolatile memory device in accordance with the present invention has a NOR type structure, and thus includes a plurality of word lines WL extended in a column direction and a plurality of bit lines BL extended in a row direction to be perpendicular to the word lines WL. Moreover, the memory cell array includes a plurality of nonvolatile memory cells MC disposed at points where the word lines WL and the bit lines BL are perpendicular to each other, and selection transistors ST selectively connecting the nonvolatile memory cells MC and a common source line CSL. The nonvolatile memory cell MC includes a control gate connected to the word line WL, a drain region connected to the bit line BL and a source region connected to a drain region of the selection transistor ST.

Referring to operational characteristics of the nonvolatile memory device having the above cell array structure, a program operation of the nonvolatile memory cell is performed by a channel hot electrode injection (CHEI) method and an erase operation thereof is performed by a Fouler Nordheim tunneling method.

Table 1 shows bias conditions according to each operation.

TABLE 1

|  | Program | Erase | Read |
| --- | --- | --- | --- |
| Word line (Control gate) | 9 V | Ground (0 V) | 2.5 V |
| Bit line (Drain region) | 5 V | Floating | 1.0 V |
| Common source line (Source region) | Ground (0 V) | Floating | Ground (0 V) |
| Selection transistor | Turn-on | Turn-off | Turn-on |
| Substrate (Well region) | Ground (0 V) | 14 V | Ground (0 V) |

For instance, in the program operation, a selected word line WL is supplied with about 9 V and its corresponding bit line BL is supplied with about 5 V. A source region of a corresponding memory cell MC is grounded through the common source line CSL by turning on the selection transistor ST. A substrate, i.e., a well region, is grounded. According to this bias condition, hot carriers, i.e., hot electrons, generated in a channel region are injected to a floating gate of the memory cell MC and thus the program operation is completed.

In the erase operation, the selected word line WL is grounded and the bit line BL is grounded or floated. Thus, the source region of the memory cell MC is floated by turning off the selection transistor ST. The substrate is supplied with a high voltage of about 14 V. According to this bias condition, the electrons injected to the floating gate are emitted to the substrate and thus the floating gate is in an electron depletion state. As a result, the erase operation is completed.

A read operation is an operation that data stored in the memory cell MC is read out. In the read operation, the selected word line WL is supplied with about 2.5 V and the bit line BL is supplied with about 1 V. The source region of the memory cell MC is grounded through the common source line CSL by turning on the selection transistor ST. The substrate maintains its ground state.

If the memory cell MC is in a program state, the memory cell MC maintains its turn-off state without being turned on by the voltage of about 2.5 V supplied to the word line WL. Thus, the voltage of about 1 V supplied from the bit line BL is not discharged to the common source line CSL. Meanwhile, if the memory cell MC is in an erase state, the memory cell MC is turned on by the voltage of about 2.5 V supplied to the word line WL and thus the voltage of about 1 V supplied from the bit line BL is discharged to the common source line CSL through the memory cell MC that is turned on. As described above, it is possible to judge whether the memory cell MC is in the program state or the erase state according to whether the voltage supplied from the bit line BL is discharged or not.

Hereinafter, nonvolatile memory cells in accordance with specific embodiments of the present invention will be described.

Figure 4:
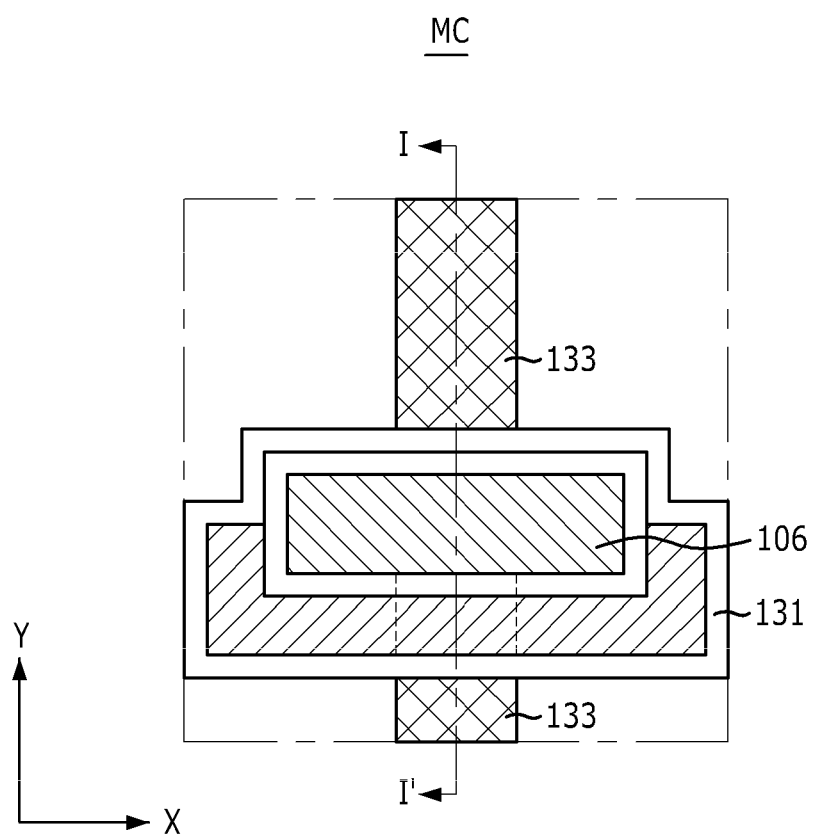
FIG. 4 illustrates a plane view of a nonvolatile memory cell in accordance with a first embodiment of the present invention.
Figure 5:
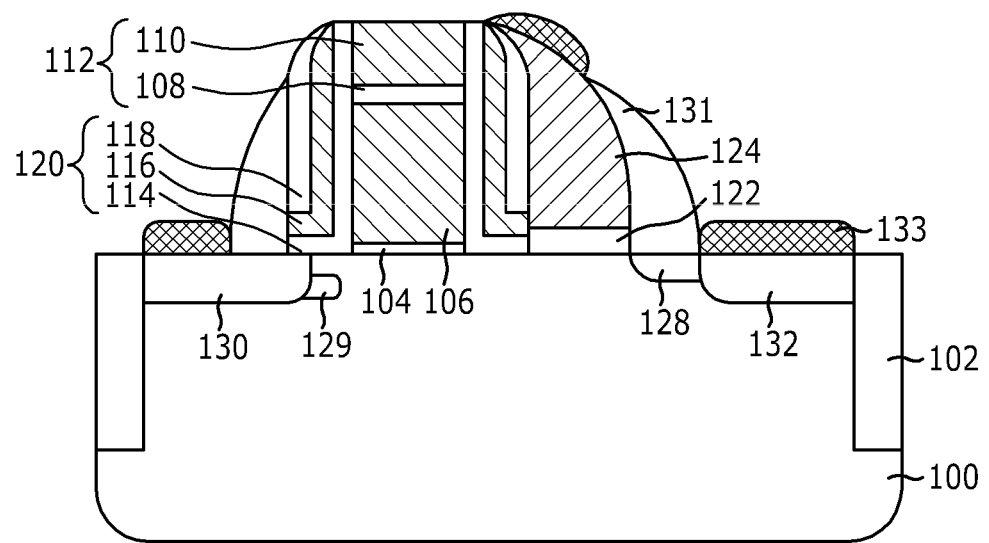
FIG. 5 illustrates a cross-sectional view taken along a line I-I' described in FIG. 4.

FIG. 4 illustrates a plane view of a nonvolatile memory cell in accordance with a first embodiment of the present invention. FIG. 5 illustrates a cross-sectional view taken along a line I-I' described in FIG. 4. Even though a silicide layer 133 formed on a control gate 124 shown in FIG. 5 is also formed on the control gate 124 described in FIG. 4, it is not illustrated in FIG. 4 for the simplicity of explanation.

Referring to FIGS. 4 and 5, the nonvolatile memory cell in accordance with the first embodiment of the present invention includes the control gate 124 that is formed on a dielectric layer 120 to cover at least one sidewall of a floating gate 106. Preferably, the control gate 124 is formed on the dielectric layer 120 to cover one of both sidewalls existing on a uniaxial plane of the floating gate 106, e.g., in a Y axial direction in FIG. 4. Furthermore, the control gate 124 is formed in a direction that a source region 132 is formed.

The nonvolatile memory cell in accordance with the first embodiment of the present invention further includes a halo region 129 formed in a substrate 100 to be in contact with a drain region 130. The halo region 129 is formed with a different conductive type from those of the drain and source regions 130 and 132. The halo region 129 enhances the generation of hot carriers in a junction region between the drain region 130 and the halo region 129 in a program operation of the cell using the CHEI method, so that the effectiveness of the program operation can be improved. In other words, the hot carriers are generated in a junction region between the drain region 130 and a well region, i.e., a channel region (not shown), and thus the hot carriers are additionally generated by the junction region between the drain region 130 and the halo region 129 in case of forming the halo region 129. Therefore, it is possible to enhance the effectiveness of the program operation as much as the hot carriers that are additionally generated.

The nonvolatile memory cell in accordance with the first embodiment of the present invention includes the drain region 130 and the source region 132 that are formed in the substrate 100, wherein the floating gate 106 is disposed between the drain region 130 and the source region 132. The drain region 130 is formed to be in contact with or aligned with a lower portion of the dielectric layer 120 where the control gate 124 is not formed, wherein the dielectric layer 120 is formed on both sidewalls of the floating gate 106. The source region 132 is formed in a direction that the control gate 124 is formed. Moreover, the source region 132 is formed to be separated at a certain distance from the control gate 124. The drain region 130 and the source region 132 have the same doping concentration and the same depth.

The nonvolatile memory cell in accordance with the first embodiment of the present invention further includes a lightly doped drain (LDD) region 128 formed in a portion of the substrate 100 between the control gate 124 and the source region 132. The LDD region 128 is formed with lower doping concentration than those of the drain and source regions 130 and 132 and has a small depth from the top surface of the substrate 100. The LDD region 128 is formed only in the direction that the source region 132 is formed on the basis of the floating gate 106. Therefore, the nonvolatile memory cell in accordance with the first embodiment of the present invention has an asymmetric structure in the Y axial direction on the basis of the floating gate 106 as shown in FIG. 5.

As described above, in the nonvolatile memory cell in accordance with the first embodiment of the present invention, the reason why the LDD region 128 is formed with the asymmetric structure is to achieve advantageous operational characteristics.

Figure 6A:
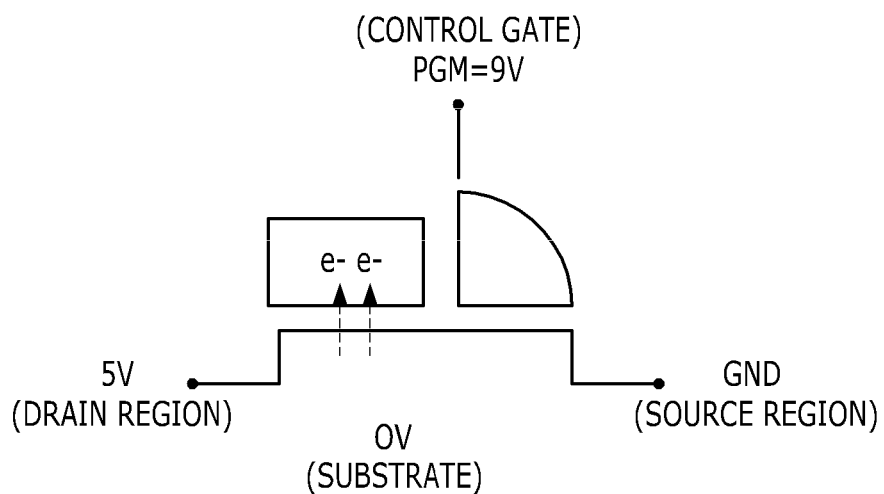
FIGS. 6A to 6C are views explaining operational characteristics of the nonvolatile memory cell in accordance with the first embodiment of the present invention.
Figure 6B:
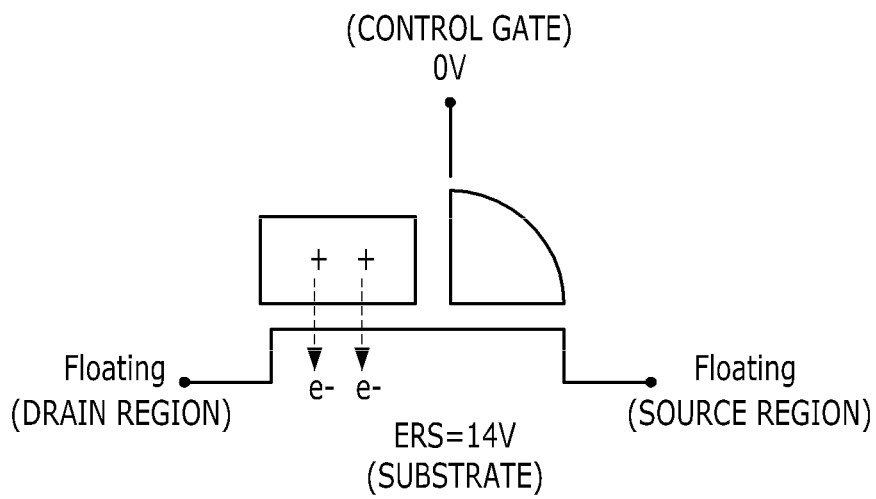
Figure 6C:
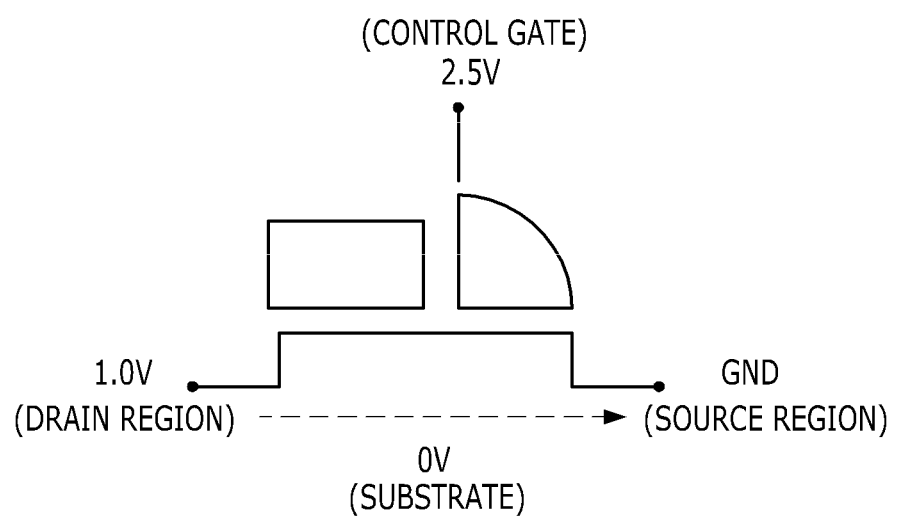

FIGS. 6A to 6C illustrate views explaining the operational characteristics of the nonvolatile memory cell in accordance with the first embodiment of the present invention. Operational conditions in the program, erase and read operations are the same as those described in Table 1.

As shown in FIGS. 6A to 6C, in the nonvolatile memory cell in accordance with the first embodiment of the present invention, the program operation is performed by the CHEI method and the erase operation is performed by the Fouler Nordheim tunneling method.

According to the operational characteristics, it is preferable that the nonvolatile memory cell in accordance with the first embodiment of the present invention forms the LDD region 128 only in the direction that the source region 132 is formed on the basis of the floating gate 106 so that the junction regions of the memory cell have the asymmetric structure.

For instance, the case that the nonvolatile memory cell in accordance with the first embodiment of the present invention has an N-channel will be described. That is, the drain and source regions 130 and 132 are formed with an N$^+$ type; the LDD region 128 is formed with an N$^-$ type; and the substrate 100, i.e., the well region (not shown), is formed with a P type.

In order to improve the program operation, a lot of hot electrons should be generated. To increase the generation of the hot electrons, the difference between doping concentration of the drain region 130 and that of the well region should be great. Therefore, it is preferable to form a single junction structure that is doped with high concentration instead of a graded junction structure in a direction that the drain region 130 is formed. Herein, the graded junction structure means that the junction region is formed with the LDD region 128 and the source region 132 in the direction that the control gate 124 is formed as shown in FIG. 5 and thus the doping concentration of the junction region is gradually increased. This graded junction structure may be implemented by forming a drift region instead of the LDD region 128. That is, it is possible to implement the graded junction structure by forming the source region in the drift region. The graded junction structure using the drift region may be another embodiment of the present invention.

In case that the graded junction region is formed in the direction that the drain region 130 is formed, the N type doping concentration is gradually decreased as going to the well region, i.e., the floating gate 106. Accordingly, the generation of the hot electrons is reduced in the drain region 130 and its neighboring area, and thus the program operation is deteriorated. Therefore, it is preferable to form the signal junction structure without forming the LDD region in the direction that the drain region 130 is formed, as shown in FIG. 5.

In the meantime, it is preferable to form the graded junction structure in the direction that the source region 132 is formed by forming the LDD region 128. Thus, in case the LDD region 128 is formed in the direction that the source region 132 is formed, it is possible to stably secure a channel length. Furthermore, since the source region 132 plays a role of providing a path through which a current flows in the read operation, the graded junction structure does not affect the program operation.

Figure 7:
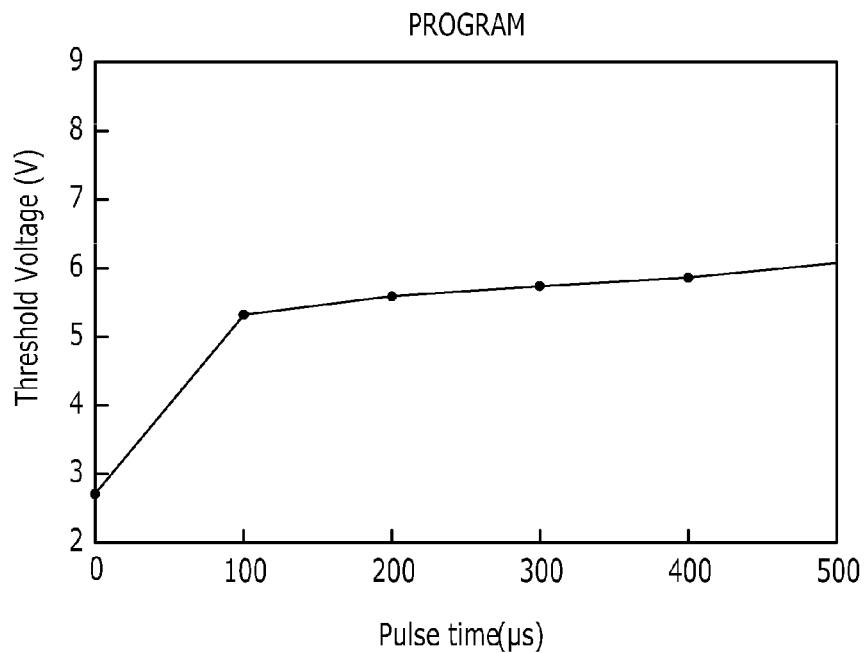
FIG. 7 is a graph showing a program operational characteristic of the nonvolatile memory cell in accordance with the first embodiment of the present invention.
Figure 8:
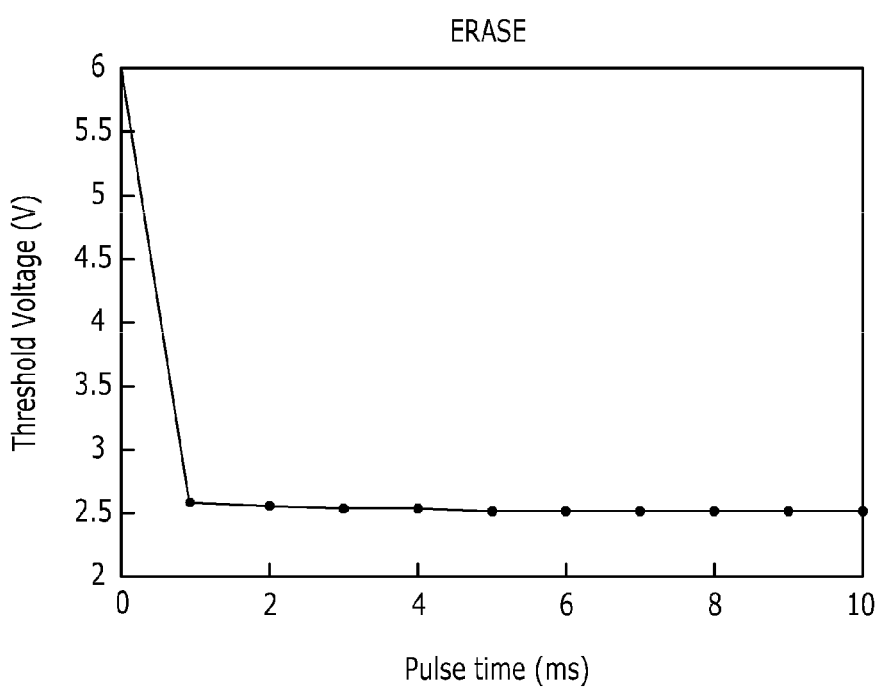
FIG. 8 is a graph showing an erase operational characteristic of the nonvolatile memory cell in accordance with the first embodiment of the present invention.

FIGS. 7 and 8 illustrate a program operational characteristic and an erase operational characteristic of the nonvolatile memory cell in accordance with the first embodiment of the present invention for the pulse stress under the operational conditions described in Table 1 and FIGS. 6A to 6C. As illustrated in FIGS. 7 and 8, the nonvolatile memory cell in accordance with the first embodiment of the present invention shows a stable threshold voltage characteristic after the program operation and the erase operation are performed.

As shown in FIG. 5, the nonvolatile memory cell in accordance with the first embodiment of the present invention includes the dielectric layer 120 formed on both sidewalls of the floating gate 106. The dielectric layer 120 may be formed between the floating gate 106 and the control gate 124, or to surround the sidewalls of the floating gate 106 regardless of the control gate 124. The dielectric layer 120 may include a stack structure where an oxide layer and a nitride layer are alternately stacked. For instance, the dielectric layer 120 includes an oxide-nitride-oxide layer. Moreover, the dielectric layer 120 may be formed of metal oxide having a dielectric constant that is higher than that of a silicon oxide layer. For instance, the metal oxide includes hafnium oxide ($HfO_2$), aluminum oxide ($Al_2O_3$), zirconium oxide ($ZrO_2$), tantalum oxide ($Ta_2O_5$), and so on.

Furthermore, the nonvolatile memory cell in accordance with the first embodiment of the present invention includes a gate insulation layer 122 formed between the control gate 124 and the substrate 100 to electrically isolate the control gate 124 from the substrate 100. The gate insulation layer 122 is formed to have a thickness greater than that of a tunnel insulation layer 104 formed under the floating gate 106 so that the electrical tunneling does not occur in the program operation.

FIGS. 9A to 9E illustrate a method for fabricating the nonvolatile memory cell in accordance with the first embodiment of the present invention.

Figure 9A:
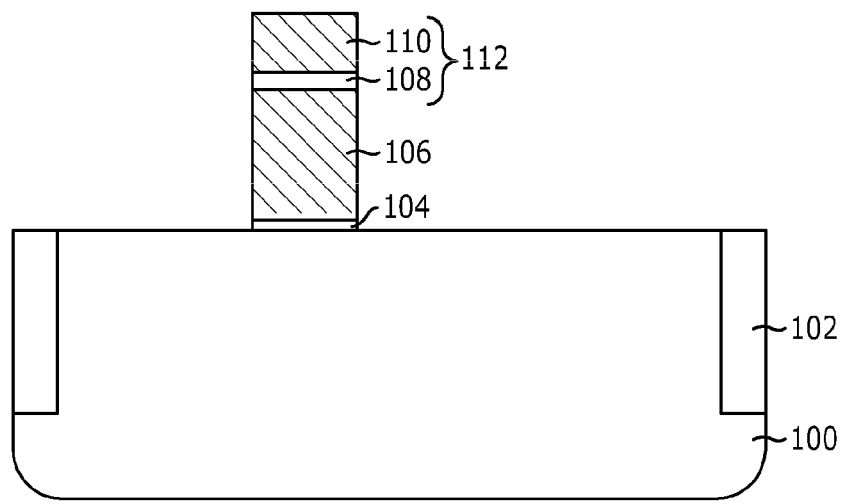
FIGS. 9A to 9E illustrate a method for fabricating the nonvolatile memory cell in accordance with the first embodiment of the present invention.

Referring to FIG. 9A, the well region (not shown) is formed in the substrate 100. For instance, the well region is formed with a dose of approximately $1\times10^{11}$ to approximately $1\times10^{12}$ atoms/cm$^2$, preferably, approximately $1\times10^{12}$ atoms/cm$^2$, using a P type dopant.

After then, an isolation layer 102 is formed in the substrate 100. The isolation layer 102 is formed performing a local oxidation of silicon (LOCOS) process or a shallow trench isolation (STI) process.

A tunnel insulation layer 104 is formed over the substrate 100 including the isolation layer 102. The tunnel insulation layer 104 may include a pure oxide layer or one selected from a group consisting of metal oxide layers having a high dielectric constant. Moreover, the tunnel insulation layer 104 may be formed of an oxynitride layer. The oxynitride layer may include an oxide layer containing a certain amount of nitride elements therein. The tunnel insulation layer 104 may be formed to have a thickness less than 100 Å, preferably, in a range of approximately 50 Å to approximately 80 Å. For example, in case the tunnel insulation layer 104 is formed of the pure oxide layer, it may be formed performing one of a dry oxidation process, a wet oxidation process and an oxidation process using radical ions.

A floating gate layer corresponding to the floating gate 106 is formed on the tunnel insulation layer 104. The floating gate layer is formed using a polysilicon layer that is doped or undoped with impurity ions. The floating gate layer may be formed to have a thickness equal to or greater than 1000 Å, preferably, in a range of approximately 1000 Å to approximately 5000 Å with regard to its coupling ratio. For instance, in case the floating gate layer is formed of the doped polysilicon layer, it is formed by performing a low pressure chemical vapor deposition (LPCVD) process using $SiH_4$ and $PH_3$ gases or $Si_2H_6$ and $PH_3$ gases. On the other hand, in case the floating gate layer is formed of the undoped polysilicon layer, it is formed by performing the LPCVD process using a $SiH_4$ gas or a $Si_2H_6$ gas and then doping impurity ions through an ion implantation process. Herein, the ion implantation process is performed to form the source region and the drain region.

Then, a hard mask layer corresponding to a hard mask 112 is formed on the floating gate layer. The hard mask 112 compensates an etch margin due to the insufficiency of a thickness of a photoresist pattern used as an etch mask in a subsequent etch process for defining the floating gate 106, and acts as a protection layer for protecting the floating gate 106. The hard mask 112 is formed of an oxide layer or a nitride layer, or may include a stack structure of an oxide layer 108 and a nitride layer 110 as described in FIG. 9A.

Subsequently, the floating gate 106 having a profile described in FIG. 9A is formed by sequentially etching the hard mask layer, the floating gate layer and the tunnel insulation layer 104. At this time, the etch process is performed using a dry etch process to form a vertical profile.

Figure 9B:
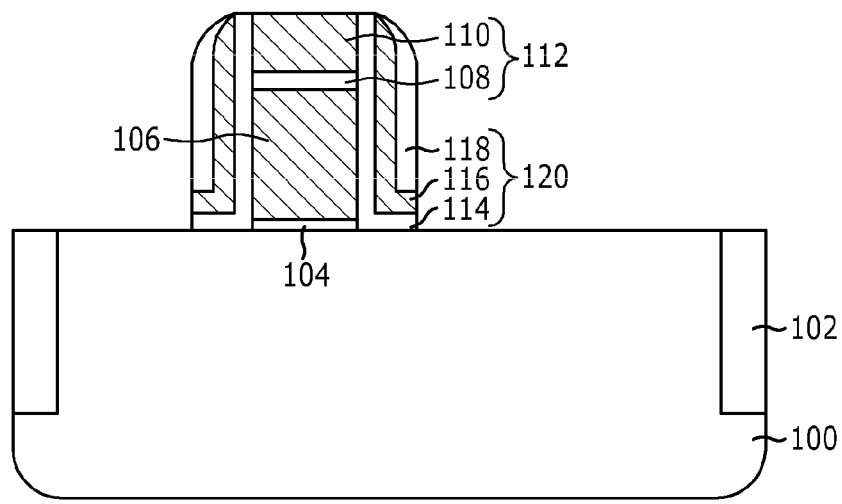

Referring to FIG. 9B, the dielectric layer 120 is formed on both sidewalls of the floating gate 106. Preferably, the dielectric layer 120 is formed to cover both sidewalls of the tunnel insulation layer 104, the hard mask 112 and the floating gate 106. The dielectric layer 120 may be formed of a stack structure where an oxide layer and a nitride layer are alternately stacked. For instance, the dielectric layer 120 is formed of a stack structure including an oxide layer 114, a nitride layer 116 and an oxide layer 118 that are sequentially stacked. In addition, the dielectric layer 120 may be formed of a metal oxide layer having a high dielectric constant. The dielectric layer 120 has a thickness of approximately 50 Å to approximately 300 Å to secure an electrical characteristic.

Figure 9C:
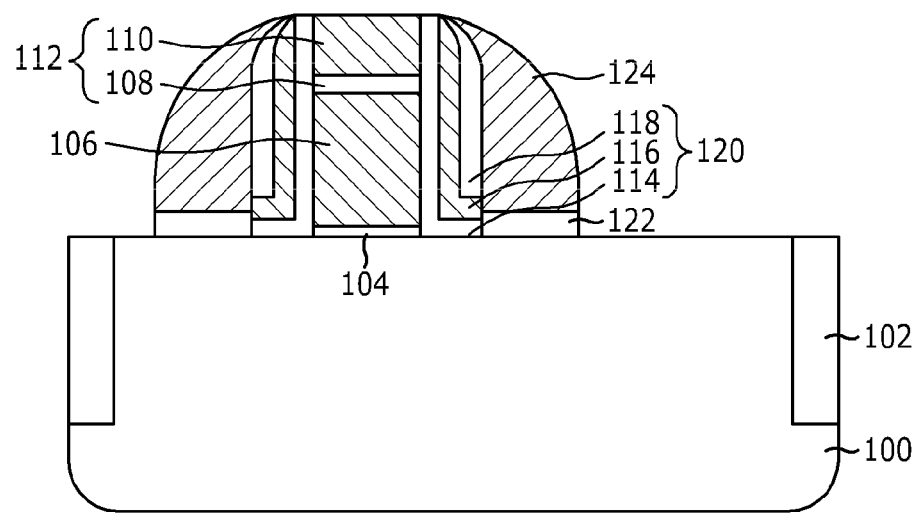

Referring to FIG. 9C, the gate insulation layer 122 is formed over portions of the substrate 100 that are exposed at both sides of the dielectric layer 120. The gate insulation layer 122 may be formed through a deposition process or a heat oxidation process. The gate insulation layer 122 has a thickness greater than that of the tunnel insulation layer 104.

The control gate 124 having a spacer shape is formed on both sidewalls of the dielectric layer 120. At this time, the bottom of the control gate 124 is separated from the substrate 100 by the gate insulation layer 122. The control gate 124 is formed by depositing a conductive layer along the whole surface of the substrate 100 including the dielectric layer 120 and performing an etch-back process on the deposited conductive layer to expose the top surface of the hard mask 112. Herein, the conductive layer may be formed of a transition metal layer or a polysilicon layer.

Figure 9D:
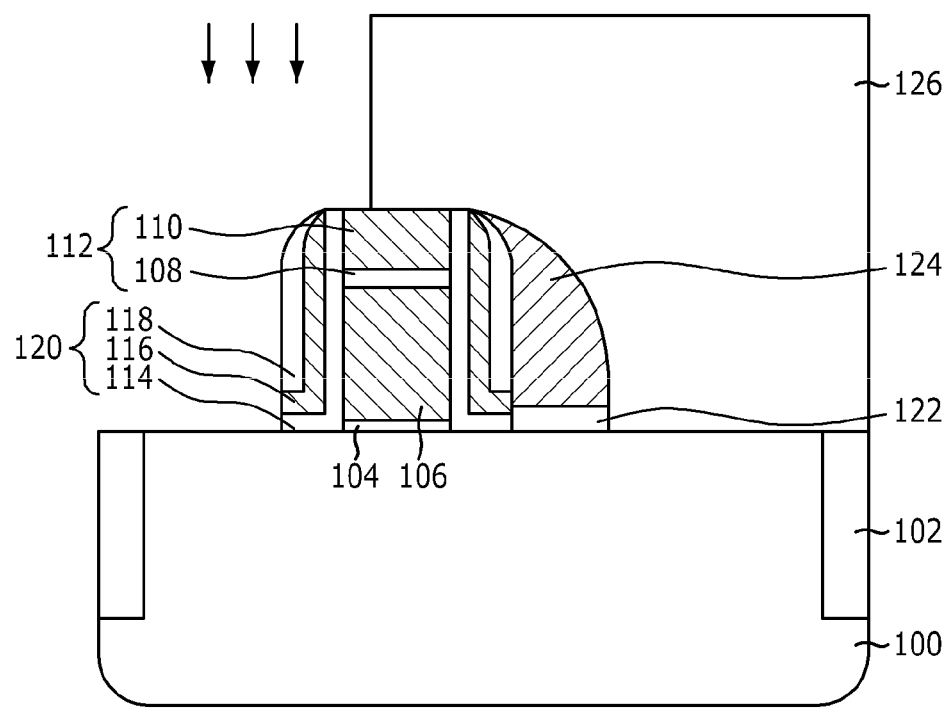

Referring to FIG. 9D, after forming a photoresist pattern 126 covering a region where the source region is to be formed and opening a region where the drain region is to be formed using the floating gate 106 as a border, an exposed portion of the control gate 124 is removed using the photoresist pattern 126 as an etch mask. Therefore, the exposed portion of the control gate 124 corresponding to the region where the drain region is to be formed is removed and the control gate 124 only remains in a region corresponding to the region where the source region is to be formed.

Figure 9E:
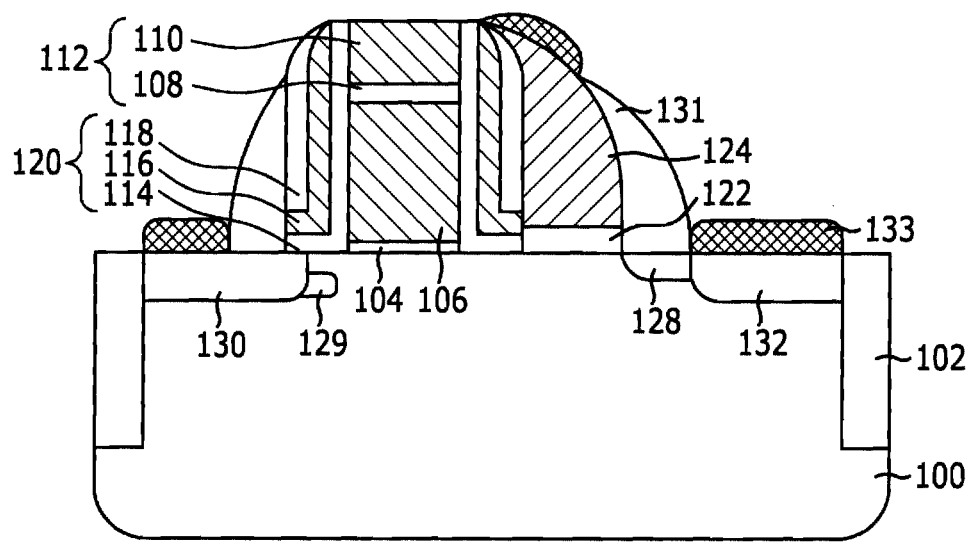

Referring to FIG. 9E, the LDD region 128 is formed in an exposed portion of the substrate 100 at one side of the control gate 124. The LDD region 128 is formed with relatively low concentration to have a small depth from the top surface of the substrate 100. The LDD region 128 is formed to have the same conductive type as those of the source and drain regions. The LDD region 128 is formed at one side of the floating gate 106 instead of being symmetrically formed at right and left sides of the floating gate 106. That is, the LDD region 128 is asymmetrically formed on the basis of the floating gate 106. For instance, the LDD region 128 is formed with a dose of approximately $1 \times 10^{11}$ to approximately $1 \times 10^{13}$ atoms/cm$^2$, preferably, approximately $1 \times 10^{12}$ atoms/cm$^2$.

Before or after forming the LDD region 128, the halo region 129 is formed toward the direction that the drain region is to be formed. The halo region 129 is formed with higher concentration than that of the well region and has the same conductive type as that of the well region. Thus, the difference between the doping concentration of the drain region 130 and that of the halo region 129 becomes greater than that between the doping concentration of the drain region 130 and that of the well region, thereby increasing the generation of hot electrons at the junction region between the drain region 130 and the halo region 129. For instance, the halo region 129 is formed with a dose of approximately $1 \times 10^{12}$ to approximately $1 \times 10^{14}$ atoms/cm$^2$, preferably, approximately $1 \times 10^{13}$ atoms/cm$^2$, using a P type dopant. At this time, the process of forming the halo region 129 is performed in conditions that an ion implantation energy is in a range of approximately 20 KeV to approximately 30 KeV and the tilt is in a range of approximately 15° to approximately 60°.

After then, the drain region 130 is formed in a portion of the substrate 100 that is not covered by the dielectric layer 120. The ion implantation process of forming the halo region 129 and the drain region 130 may be performed without a limitation in its performing order. That is, the ion implantation process may be performed after the process of forming the dielectric 120 in FIG. 9B or the etch process of selectively removing the control gate 124 formed toward the direction that the drain region is to be formed in FIG. 9D. For instance, the drain region 130 is formed with a dose of approximately $1 \times 10^{14}$ to approximately $1 \times 10^{15}$ atoms/cm$^2$ using an N type dopant.

Subsequently, a spacer 131 is formed on sidewalls of the dielectric layer 120 and the control gate 124. The spacer 131 may include an oxide layer, a nitride layer, or a stack structure of the oxide layer and the nitride layer. The spacer 131 is formed performing a deposition process and then an etch-back process. After the etch-back process, the hard mask 112 is exposed and a portion of the control gate 124 is also exposed.

Then, the source region 132 is formed in a portion of the substrate 100 that is exposed without being covered by the spacer 131. The source region 132 is formed with higher concentration to have a depth greater than that of the LDD region 128. Moreover, the source region 132 has the same conductive type as that of the drain region 130. The drain region 130 is formed in contact with the dielectric layer 120 and the source region 132 is formed to be separated at the certain distance from one side of the control gate 124. For example, the source region 132 is formed with a dose of approximately $1 \times 10^{14}$ to approximately $1 \times 10^{15}$ atoms/cm$^2$, using an N type dopant.

After forming the source region 132, a silicide layer 133 may be formed on portions of the control gate 124, the drain region 130 and the source region 132 that are exposed performing a self aligned silicide process. The silicide layer 133 plays a role of lowering resistivity of the control gate 124, the drain region 130 and the source region 132. The silicide layer 133 is formed of a transition metal such as cobalt (Co) and titanium (Ti).

As another example, FIGS. 10A to 10E illustrate another method for fabricating the nonvolatile memory cell in accordance with the first embodiment of the present invention described in FIGS. 4 and 5.

Figure 10A:
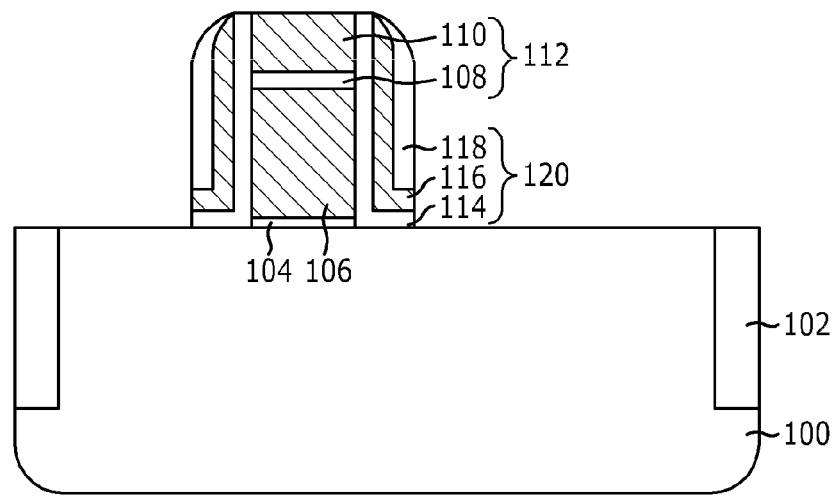
FIGS. 10A to 10E illustrate another method for fabricating the nonvolatile memory cell in accordance with the first embodiment of the present invention.

Referring to FIG. 10A, the tunnel insulation layer 104, the floating gate 106, the hard mask 112 and the dielectric layer 120 are formed in the same manner as that described in FIGS. 9A and 9B.

Figure 10B:
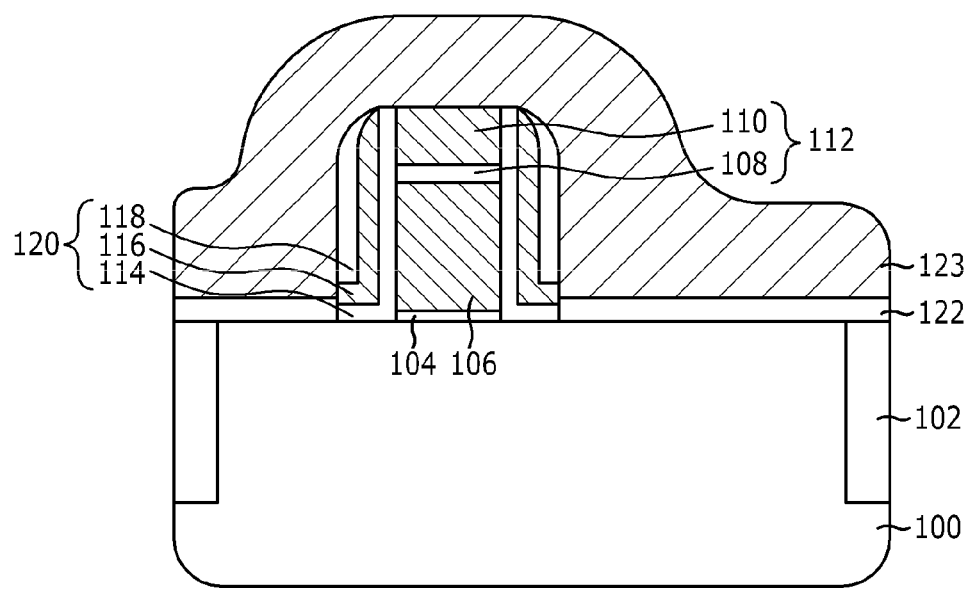

After forming the dielectric layer 120, as illustrated in FIG. 10B, the gate insulation layer 122 is formed on a portion of the substrate 100 that is exposed at both sides of the dielectric layer 120. The gate insulation layer 122 may be formed performing a deposition process or a heat oxidation process. Herein, the deposition process may be performed through a chemical vapor deposition (CVD) process and the heat oxidation process may be performed through a dry process or a wet process. Moreover, the gate insulation layer 122 may have a thickness greater than that of the tunnel insulation layer 104 so that the electron tunneling is not caused through the gate insulation layer 122. Preferably, the thickness of the gate insulation layer 122 is in a range of approximately 100 Å to approximately 300 Å.

A conductive layer 123 is formed on the whole surface of the substrate 100 including the gate insulation layer 122. The conductive layer 123 may be formed of a transition metal layer or a polysilicon layer.

Figure 10C:
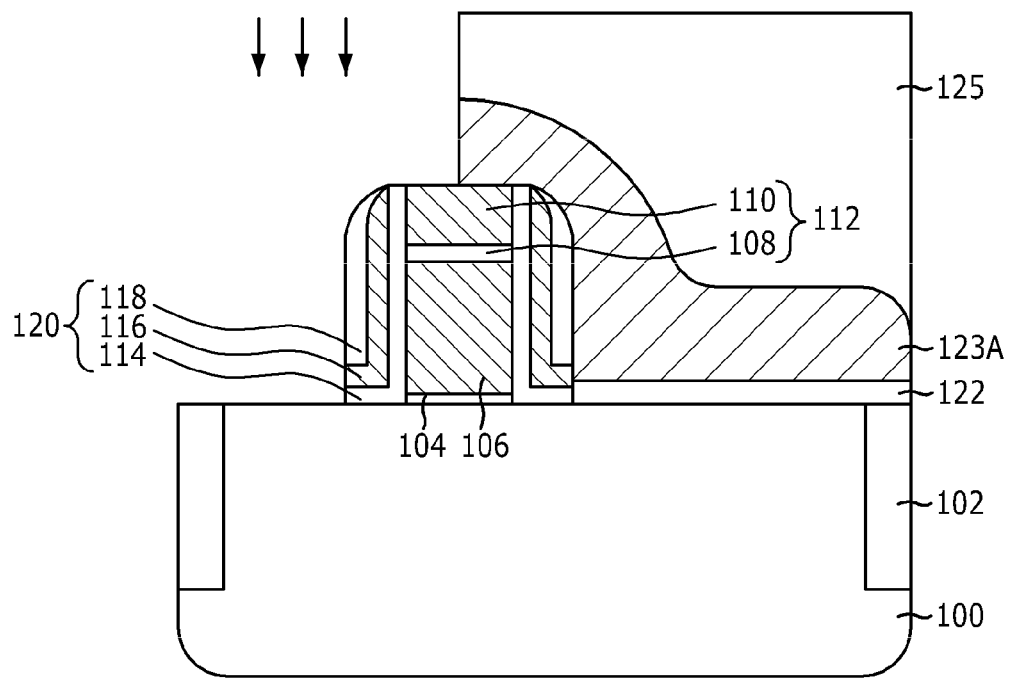

Referring to FIG. 10C, after forming a photoresist pattern 125 on the conductive layer 123 to cover a region including a region where the source region is to be formed and to open a region including a region where the drain region is to be formed using the floating gate 106 as a border, an exposed portion of the conductive layer 123 is removed using the photoresist pattern 125 as an etch mask to remain a conductive pattern 123A only in the region that the source region is to be formed. In this process, the gate insulation layer 122 formed in the region that the drain region is to be formed is also removed.

Figure 10D:
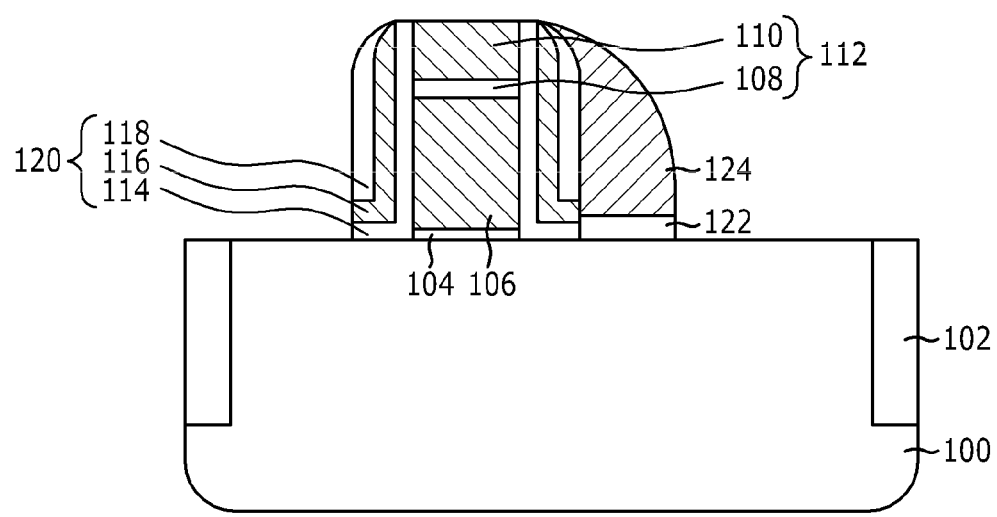

After forming the conductive pattern 123A, an etch-back process is performed on the conductive pattern 123A so that the conductive pattern 123A only remains as described in FIG. 10D to form the control gate 124 having a spacer shape on the sidewall of the dielectric layer 120.

Figure 10E:
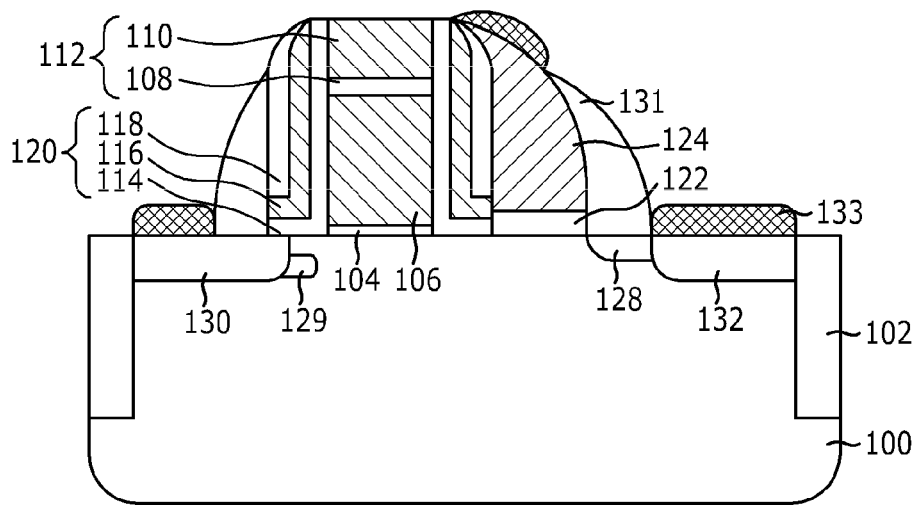

Subsequently, as illustrated in FIG. 10E, after forming the LDD region 128, the halo region 129 and the drain region 130 in the portions of the substrate 100 that are exposed at one sides of the control gate 124 and the dielectric layer 120, respectively, the spacer 131 is formed. Then, the source region 132 is formed in the portion of the substrate 100 that is exposed without being covered by the spacer 131 and the silicide layer 133 is formed on the exposed portions of the drain region 130, the source region 132 and the control gate 124.

Meanwhile, it is described that the halo region 129 and the drain region 130 are formed after the control gate 124 is formed through the etch-back process in FIG. 10E. However, in another example, it is possible to form the photoresist pattern 125 by performing an ion implantation process using an ion implantation mask after forming the conductive pattern 123A in FIG. 10C to curtail a mask process.

Figure 11:
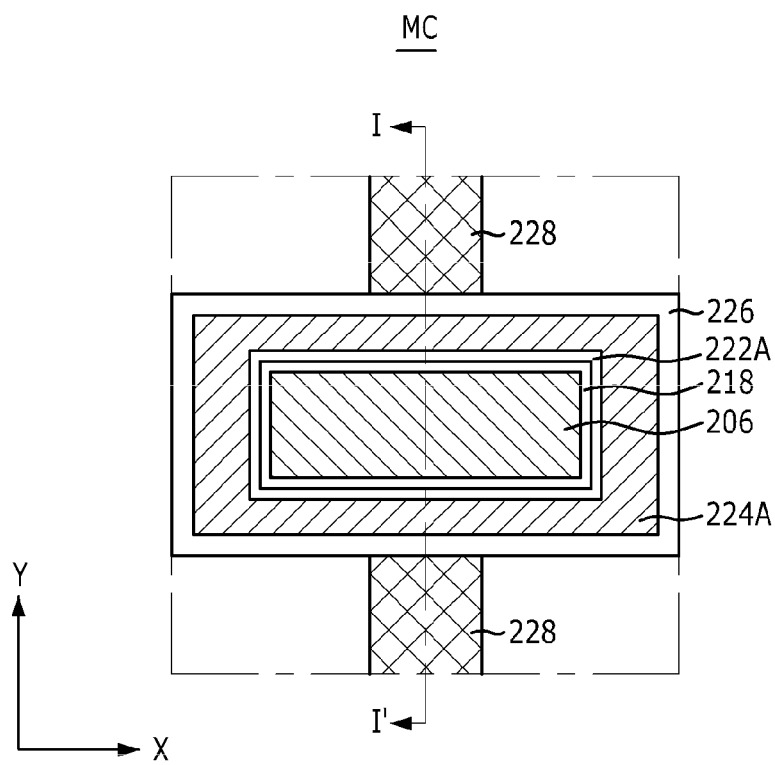
FIG. 11 illustrates a plane view of a nonvolatile memory cell in accordance with a second embodiment of the present invention.
Figure 12:
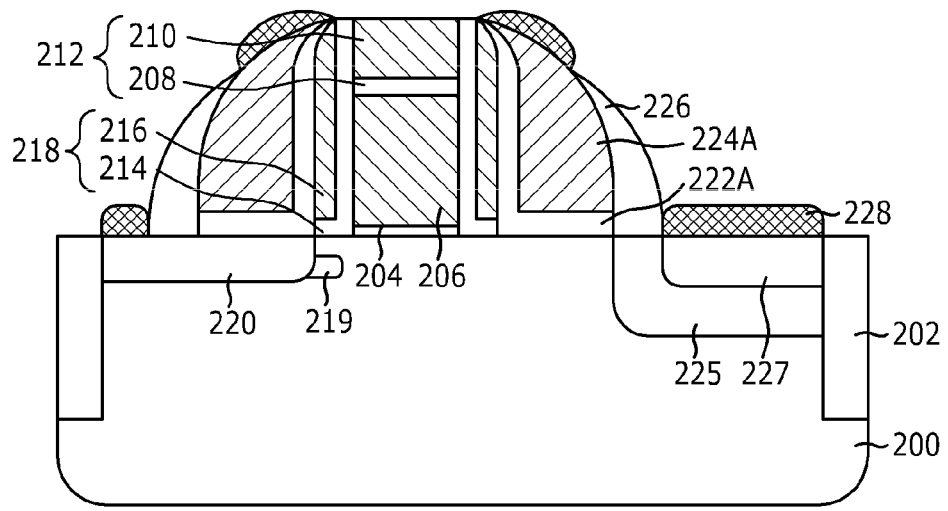
FIG. 12 illustrates a cross-sectional view taken along a line I-I' described in FIG. 11.

FIG. 11 illustrates a plane view of a nonvolatile memory cell in accordance with a second embodiment of the present invention. FIG. 12 illustrates a cross-sectional view taken along a line I-I' described in FIG. 11. Even though a silicide layer 228 formed on a control gate 224A shown in FIG. 12 is also formed on the control gate 224A described in FIG. 11, it is not illustrated in FIG. 11 for the simplicity of explanation.

Referring to FIGS. 11 and 12, unlike in the first embodiment of the present invention, the nonvolatile memory cell in accordance with the second embodiment of the present invention includes the control gate 224A formed to overlap with both sidewalls of a floating gate 206 in a Y axial direction. As described in the first embodiment of the present invention, if the control gate is formed to overlap with one sidewall of the floating gate in the Y axial direction, there is an advantage of increasing a degree of integration of the device, whereas there is a limitation in increasing a coupling ratio. Therefore, in the second embodiment of the present invention, the control gate 224A is formed to overlap with both sidewalls of the floating gate 206 in the Y axial direction to increase the coupling ratio. That is, in the plane view described in FIG. 11, the control gate 224A is formed to overlap with all of the sidewalls of the floating gate 206.

The nonvolatile memory cell in accordance with the second embodiment of the present invention further includes a drain region 220 and a source region 227 that are separately formed from each other in a substrate 200 at both sides of the floating gate 206. The drain region 220 is formed to be separated in a certain distance from the floating gate 206 and a portion of the drain region 220 overlaps with the control gate 224A. The source region 227 is formed in a drift region 225 and is separated in a certain distance from the control gate 224A.

Moreover, the nonvolatile memory cell in accordance with the second embodiment of the present invention includes the drift region 225 in which the source region 227 is formed to implement a graded junction region. The drift region 225 is formed to stably secure a channel length of the cell. Thus, it is formed to have a depth greater than that of the source region 227 with low concentration. Meanwhile, although it is not shown, the nonvolatile memory cell in accordance with the second embodiment of the present invention may include a LDD region instead of the drift region 225 as in the first embodiment.

Like in the first embodiment, the nonvolatile memory cell in accordance with the second embodiment of the present invention includes a halo region 219 formed in the substrate 200 to be adjacent to the drain region 220.

Furthermore, the nonvolatile memory cell in accordance with the second embodiment of the present invention includes a dielectric layer 218 to cover sidewalls of the floating gate 206. Like in the first embodiment, the dielectric layer 218 is formed between the floating gate 206 and the control gate 224A. The nonvolatile memory cell in accordance with the second embodiment of the present invention additionally includes a gate insulation layer 222A formed between the dielectric layer 218 and the control gate 224A. At this time, the gate insulation layer 222A is formed to be extended to a space between the control gate 224A and the substrate 200

FIGS. 13A to 13D illustrate a method for fabricating the nonvolatile memory cell in accordance with the second embodiment of the present invention.

Figure 13A:
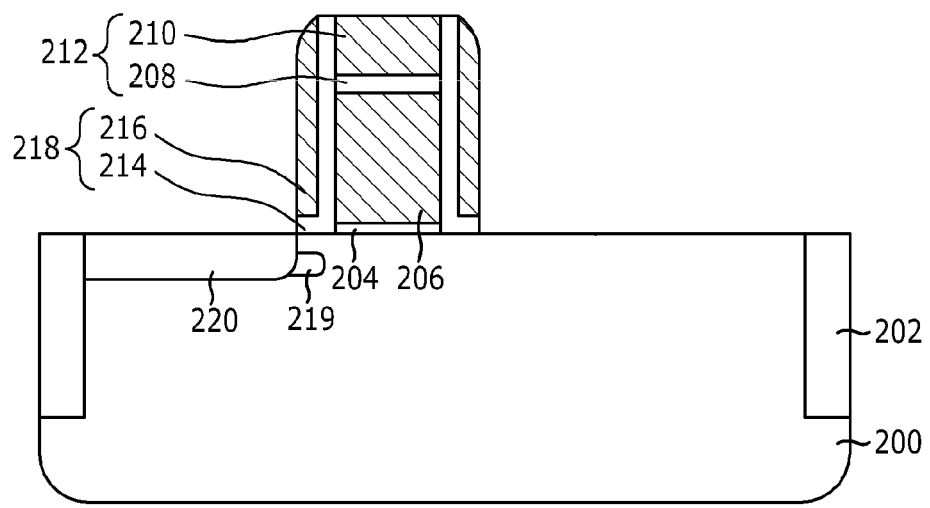
FIGS. 13A to 13D illustrate a method for fabricating a nonvolatile memory cell in accordance with the second embodiment of the present invention.

Referring to FIG. 13A, after forming an isolation layer 202 in the substrate 200 in the same manner as described in FIG. 9A, a tunnel insulation layer 204, the floating gate 206 and a hard mask 212 are formed. The hard mask 212 is formed of an oxide layer, a nitride layer or a stack structure of the oxide layer and the nitride layer. For instance, the hard mask 212 is formed of a stack structure of an oxide layer 208 and a nitride layer 210.

After sequentially depositing an oxide layer 214 and a nitride layer 216 along a profile of the top surface of the substrate 200 including the hard mask 212, an etch-back process is performed on the oxide layer 214 and the nitride layer 216 to form the dielectric layer 218 having a spacer shape on both sidewalls of the floating gate 206.

The halo region 219 is formed in a portion of the substrate 200 that is exposed at one side of the dielectric layer 218. Herein, an ion implantation process of forming the halo region 219 is performed with a dose of approximately $1\times10^{12}$ to approximately $1\times10^{14}$ atoms/cm$^2$, preferably, approximately $1\times10^{13}$ atoms/cm$^2$, using a P type dopant. At this time, the process of forming the halo region 129 is performed in conditions that an ion implantation energy is in a range of approximately 20 KeV to approximately 30 KeV and the tilt is in a range of approximately 15° to approximately 60°.

The drain region 220 is formed in a portion of the substrate 200 that is exposed at one side of the dielectric layer 218 so that the drain region 220 is adjacent to the halo region 219. The drain region 220 is formed with high concentration and to be adjacent to the dielectric layer 218. For instance, the drain region 220 is formed with a dose of approximately $1\times10^{14}$ to approximately $1\times10^{15}$ atoms/cm$^2$, using an N type dopant.

Figure 13B:
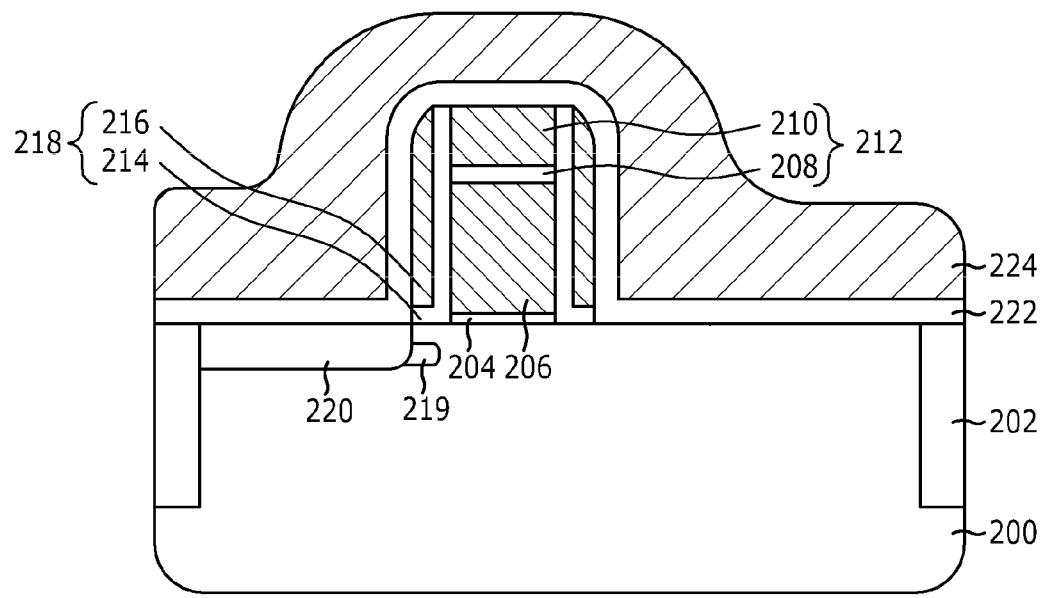

Referring to FIG. 13B, after forming the drain region 220, a gate insulation layer 222 is formed along a profile of the top surface of the substrate 200. Then, a conductive layer 224 is formed on the gate insulation layer 222. Herein, the conductive layer 224 may be formed of a transition metal layer or a polysilicon layer.

Figure 13C:
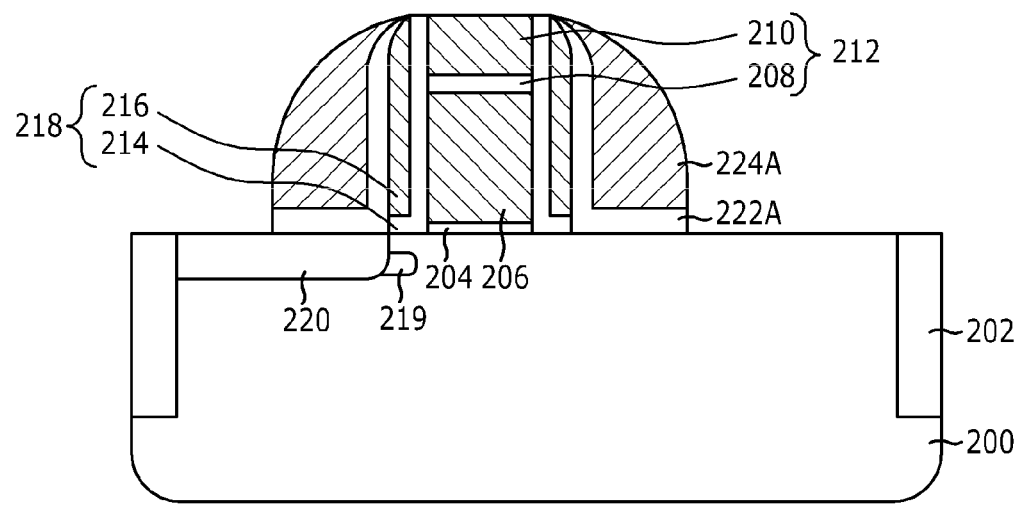

Referring to FIG. 13C, the control gate 224A having the spacer shape is formed on both sidewalls of the gate insulation layer 222 by performing an etch-back process on the conductive layer 224. In this process, the gate insulation layer 222 is also etched and thus ends of the etched gate insulation layer 222A are aligned with those of the control gate 224A.

Figure 13D:
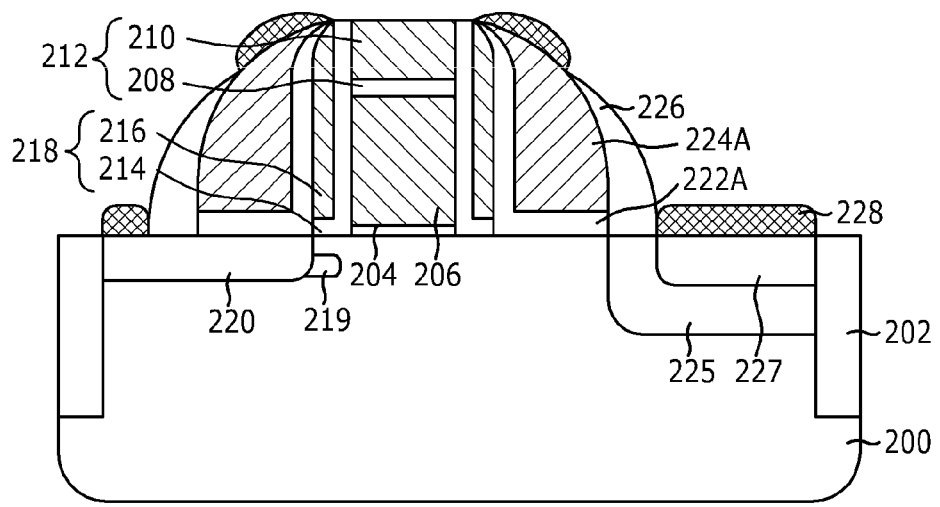

Referring to FIG. 13D, after forming a photoresist pattern (not shown) opening an area including a region where the source region is to be formed using the floating gate 206 as a border, an ion implantation process is performed using the photoresist pattern as an ion implantation mask to form the drift region 225 in the region where the source region is to be formed. The drift region 225 is formed as its ends are adjacent to those of the control gate 224A. For instance, the drift region 225 is formed with a dose of approximately $1\times10^{11}$ to approximately $1\times10^{13}$ atoms/cm$^2$, preferably, approximately $1\times10^{12}$ atoms/cm$^2$.

After forming the drift region 225, a spacer 226 is formed on the control gate 224A.

After then, the source region 227 is formed in the drift region 225. The source region 227 is formed with the same conductive type as that of the drain region 220. The source region 227 is aligned with one side of the spacer 226 and separated in a certain distance from one side of the control gate 224A. Moreover, the source region 227 is formed with higher concentration than that of the drift region 225. For instance, the source region 227 is formed with a dose of approximately $1\times10^{14}$ to approximately $1\times10^{15}$ atoms/cm$^2$, using an N type dopant.

After forming the source region 227, the silicide layer 228 may be formed performing a silicide process on portions of the control gate 224A, the drain region 220 and the source region 227 that are exposed. Herein, the silicide layer 228 is formed of a transition metal such as Co and Ti.

Figure 14:
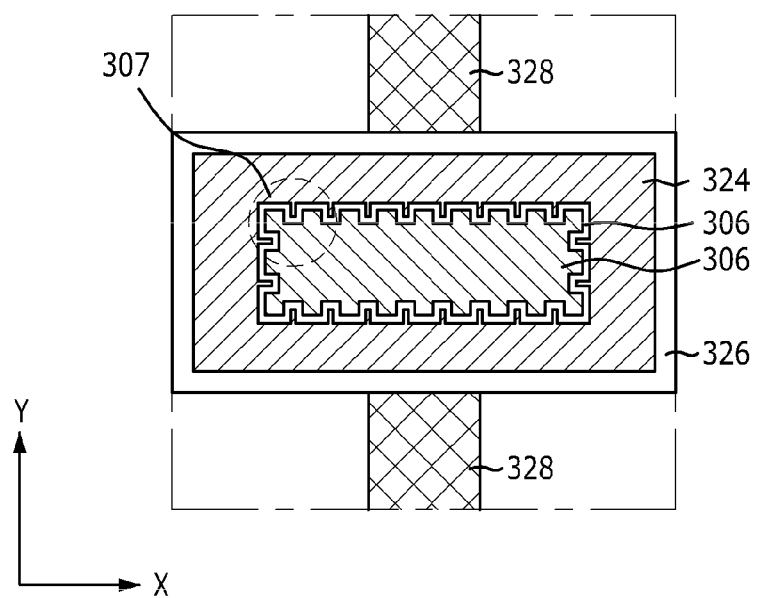
FIG. 14 illustrates a plane view of a nonvolatile memory cell in accordance with a third embodiment of the present invention.

FIG. 14 illustrates a plane view of a nonvolatile memory cell in accordance with a third embodiment of the present invention.

Referring to FIG. 14, the nonvolatile memory cell in accordance with the third embodiment includes a concavo-convex part 307 formed on a surface, i.e., the outer circumference, of a floating gate 306 to increase a coupling ratio of the cell by increasing a junction area between the floating gate 306 and a control gate 324. Preferably, the concavo-convex part 307 is formed to overlap with the control gate 324. Since other components than the floating gate 306, e.g., a drain region, a source region, etc., are formed in the same manner as those in accordance with the first and second embodiments, the detailed description thereof will be omitted herein. Meanwhile, a reference numeral 328 represents a silicide layer and a reference numeral 318 depicts a dielectric layer.

In accordance with the third embodiment of the present invention, the concavo-convex part 307 is formed on the surface of the floating gate 308 through various methods. The simplest method is to form a mask pattern used in a process of etching the floating gate 306 in the same shape as that of the floating gate 306. That is, after forming the mask pattern in the same shape as that of the floating gate 306, the floating gate 306 is etched using the mask pattern as an etch mask to thereby form the concavo-convex part 307.

In accordance with the embodiments of the present invention, it is possible to secure the following effects.

First, it is possible to improve a degree of integration of the device by forming the control gate to overlap with the sidewalls of the floating gate and thus reducing a cell size as compared to the typical split gate structure. Moreover, it is possible to reduce a driving voltage of the cell by increasing an area where the control gate overlaps with the floating gate and thus increasing the coupling ratio as well as reducing the cell size.

Second, it is possible to improve the efficiency of the program operation of the cell by selectively forming the halo region adjacent to the drain region and thus increasing the generation of hot carriers.

Third, the stable channel length can be secured at the same time of increasing the generation of hot carriers by asymmetrically forming the junction region of the nonvolatile memory cell including the drain and source regions, which results in improving the operational performance of the nonvolatile memory cell.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory cell, comprising:
   a drain region formed in a substrate;
   a source region formed in the substrate to be separated from the drain region;
   a floating gate formed over the substrate between the drain region and the source region;
   a lightly doped drain region or a drift region formed in the substrate in a direction that the source region is formed;
   a dielectric layer formed on sidewalls of the floating gate, the dielectric layer comprising a first surface disposed between the source region and the floating gate and a second surface disposed between the drain region and the floating gate;
   a control gate formed on the first surface of the dielectric layer on a side of the floating gate facing the source region; and
   a halo region formed in the substrate between the drain region and the floating gate.

2. The nonvolatile memory cell of claim 1, the lightly doped drain region or the drift region is formed in the substrate between the control gate and the source region and has lower concentration than that of the source region.

3. The nonvolatile memory cell of claim 1, wherein the drain region is formed to be closer to the floating gate than the source region.

4. The nonvolatile memory cell of claim 1, wherein the source region is formed to be separated from the control gate.

5. The nonvolatile memory cell of claim 1, wherein the dielectric layer includes a structure that an oxide layer and a nitride layer are alternately stacked.

6. The nonvolatile memory cell of claim 1, wherein a portion of the drain region overlaps with the dielectric region.

7. The nonvolatile memory cell of claim 1, further comprising:
   a tunnel insulation layer formed between the floating gate and the substrate; and
   a gate insulation layer formed between the control gate and the substrate and having a thickness greater than that of the tunnel insulation layer.

8. The nonvolatile memory cell of claim 1, further comprising a hard mask formed over the floating gate, wherein the hard mask includes one of an oxide layer, a nitride layer, a stack structure of the oxide layer and the nitride layer, and a sidewall of the hard mask are aligned with respect to one of the sidewalls of the floating gate.

9. The nonvolatile memory cell of claim 1, wherein the control gate is formed with a spacer shape over the dielectric layer.

10. The nonvolatile memory cell of claim 1, wherein the dielectric layer is formed so as to be at least one of (i) between the floating gate and the control gate, and (ii) surrounding a sidewall of the floating gate.

11. The nonvolatile memory cell of claim 1, further comprising a spacer formed over at least one of (i) the dielectric layer, and (ii) the control gate.

12. The nonvolatile memory cell of claim 1, wherein the floating gate includes a concavo-convex part on its surface and the concavo-convex part is formed to overlap with the control gate.

13. The nonvolatile memory cell of claim 1, wherein the halo region is formed in the substrate in a direction that the drain region is formed.

14. The nonvolatile memory cell of claim 13, wherein the halo region is formed to overlap with the dielectric layer.

15. The nonvolatile memory cell of claim 1, wherein the control gate extends over the dielectric layer to at least two opposite sides of the floating gate.

16. The nonvolatile memory cell of claim 15, wherein the control gate is disposed between the floating gate and the source region.

17. The nonvolatile memory cell of claim 15, further comprising:
   a tunnel insulation layer formed between the floating gate and the substrate; and
   a gate insulation layer formed between the control gate and the substrate and having a thickness greater than that of the tunnel insulation layer.

18. The nonvolatile memory cell of claim 15, wherein the halo region is formed in the substrate in a direction that the drain region is formed.

19. The nonvolatile memory cell of claim 1, the hard mask is a patterned hard mask and covers substantially an entire upper surface of the floating gate.

20. The nonvolatile memory cell of claim 1, wherein a silicide layer is formed directly on a portion of the control gate layer between the floating gate and the source region.

21. The nonvolatile memory cell of claim 1, wherein:
the dielectric layer comprises an oxide layer, a nitride layer, and another oxide layer that are sequentially stacked; and
the control gate is not formed on the second surface of the dielectric layer.

22. The nonvolatile memory cell of claim 1, wherein the drain region is spaced apart from the floating gate in a horizontal direction of the memory cell, and the halo region is disposed under the second surface of the dielectric layer between the floating gate and the drain region.

23. The nonvolatile memory cell of claim 1, wherein the control gate surrounds the floating gate in a plan view of the nonvolatile memory cell such that the control gate covers a first side wall of the floating gate and at least portions of two opposing side walls of the floating gate orthogonal to the first side wall to form a U-shape around the floating gate.

24. A nonvolatile memory cell, comprising:
a drain region formed in a substrate;
a source region formed in the substrate to be separated from the drain region;
a floating gate formed over the substrate between the drain region and the source region;
a dielectric layer formed on sidewalls of the floating gate, the dielectric layer comprising a first surface disposed between the source region and the floating gate and a second surface disposed between the drain region and the floating gate;
a control gate formed on the first surface of the dielectric layer on a side of the floating gate facing the source region and not formed on the second surface of the dielectric layer on a side of the floating gate facing the drain region, the control gate having a spacer shape; and
a halo region formed in the substrate between the drain region and the floating gate.

25. The nonvolatile memory cell of claim 24, further comprising a hard mask formed over the floating gate, wherein the hard mask includes one of an oxide layer, a nitride, layer and a stack structure of the oxide layer and the nitride layer, and a sidewall of the hard mask aligned with respect to one of the sidewalls of the floating gate.

26. The nonvolatile memory cell of claim 24, the hard mask is a patterned hard mask and covers substantially an entire upper surface of the floating gate.

27. The nonvolatile memory cell of claim 24, The nonvolatile memory cell of claim 1, wherein a silicide layer is formed on a portion of the control gate layer between the floating gate and the source region.

28. The nonvolatile memory cell of claim 24, wherein the control gate surrounds the floating gate in a plan view of the nonvolatile memory cell such that the control gate covers a first side wall of the floating gate and at least portions of two opposing side walls of the floating gate orthogonal to the first side wall to form a U-shape around the floating gate.

* * * * *